(12) United States Patent
Wang et al.

(10) Patent No.: US 11,018,065 B2
(45) Date of Patent: May 25, 2021

(54) SEMICONDUCTOR DEVICE STRUCTURE WITH MAGNETIC ELEMENT IN TESTING REGION

(71) Applicant: Taiwan Semiconductor Manufacturing Co., Ltd., Hsinchu (TW)

(72) Inventors: Mill-Jer Wang, Hsinchu (TW); Tang-Jung Chiu, Hsinchu (TW); Chi-Chang Lai, Taichung (TW); Chia-Heng Tsai, New Taipei (TW); Mirng-Ji Lii, Sinpu Township, Hsinchu County (TW); Weii Liao, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/548,183

(22) Filed: Aug. 22, 2019

(65) Prior Publication Data

US 2021/0057293 A1    Feb. 25, 2021

(51) Int. Cl.
*H01L 21/66* (2006.01)
*H01L 27/01* (2006.01)
*H01L 23/552* (2006.01)

(52) U.S. Cl.
CPC ............ *H01L 22/34* (2013.01); *H01L 23/552* (2013.01); *H01L 27/01* (2013.01)

(58) Field of Classification Search
CPC ........ H01L 22/34; H01L 23/552; H01L 27/01
See application file for complete search history.

(56) References Cited

U.S. PATENT DOCUMENTS 3,614,554 A * 10/1971 Shield ................. H01L 23/5227
257/531
6,552,554 B1 * 4/2003 Prinz ....................... G11C 11/16
324/632

* cited by examiner

*Primary Examiner* — Peniel M Gumedzoe
(74) *Attorney, Agent, or Firm* — McClure, Qualey & Rodack, LLP

(57) ABSTRACT

A semiconductor device structure is provided. The semiconductor device structure includes a semiconductor substrate having a testing region and multiple first conductive lines over the testing region. The first conductive lines are electrically connected in series. The semiconductor device structure also includes multiple second conductive lines over the testing region. The second conductive lines are electrically connected in series, and the second conductive lines are physically separated from the first conductive lines. The semiconductor device structure further includes multiple magnetic structures wrapping around portions of the first conductive lines and wrapping around portions of the second conductive lines. The magnetic structures are arranged in a column.

20 Claims, 9 Drawing Sheets

SEMICONDUCTOR DEVICE STRUCTURE WITH MAGNETIC ELEMENT IN TESTING REGION

BACKGROUND

The semiconductor integrated circuit (IC) industry has experienced rapid growth. Technological advances in IC materials and design have produced generations of ICs. Each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

One of the factors in the continuing evolution toward smaller device size and higher density has been the ability to consistently form reliable integrated circuit at smaller critical dimensions. In integrated circuit (IC) manufacturing, a semiconductor wafer may contain multiple test structures between wafer die areas. Each test structure includes one or more test devices, which are devices similar to those that are used to form the integrated circuit products in the wafer die areas. By studying the test structures, it is possible to monitor, improve, and refine a semiconductor manufacturing process. For example, the reliability and electrical continuity of integrated circuitry wiring is determined by electrical continuity measurement methods following formation of a metallization level of circuitry wiring, also referred to as acceptance testing (WAT), to quickly determine and correct processing variables that may be causing circuitry defects.

There is a continuing need in the semiconductor device manufacturing art for improved wafer acceptance testing (WAT) methods. However, since feature sizes continue to decrease, fabrication processes and the corresponding testing processes continue to become more difficult to perform. Therefore, it is a challenge to monitor, improve, and refine the manufacturing processes of semiconductor devices with smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
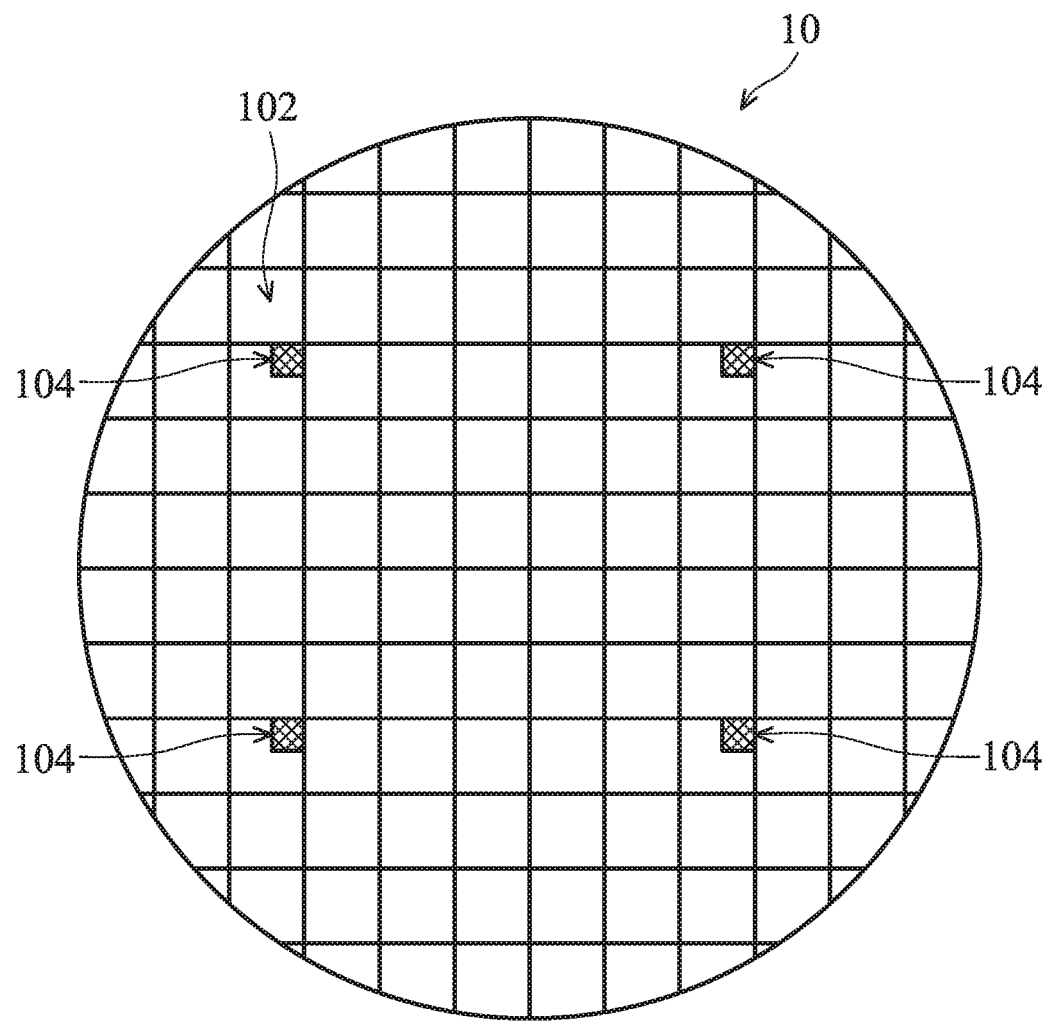
FIG. 1 is a top view of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIG. 1 is a top view of a semiconductor device structure 10, in accordance with some embodiments. In some embodiments, the semiconductor device structure 10 is a semiconductor wafer. The semiconductor device structure 10 includes multiple device regions (or die regions) 102 and multiple testing regions 104. In some embodiments, each of the testing regions 104 is surrounded by some of the device regions 102. In some embodiments, each of the testing regions 104 has a smaller area than the area of each of the device regions 102.

In some embodiments, the testing regions 104 include devices that are similar to or substantially the same as those formed in the device regions 102. In some embodiments, the devices formed in the testing regions 104 and the device regions 102 are simultaneously formed using the same processes. In some embodiments, both the testing regions 104 and the device regions 102 include inductors such as mutual inductors. By studying and/or inspecting the devices formed in the testing regions 104, it is possible to monitor, improve, and refine a semiconductor manufacturing process timely. For example, the quality and reliability of the inductors formed in the device regions 102 may be monitored timely by detecting the electrical signals obtained from the devices formed in the testing regions 104.

Figure 9:
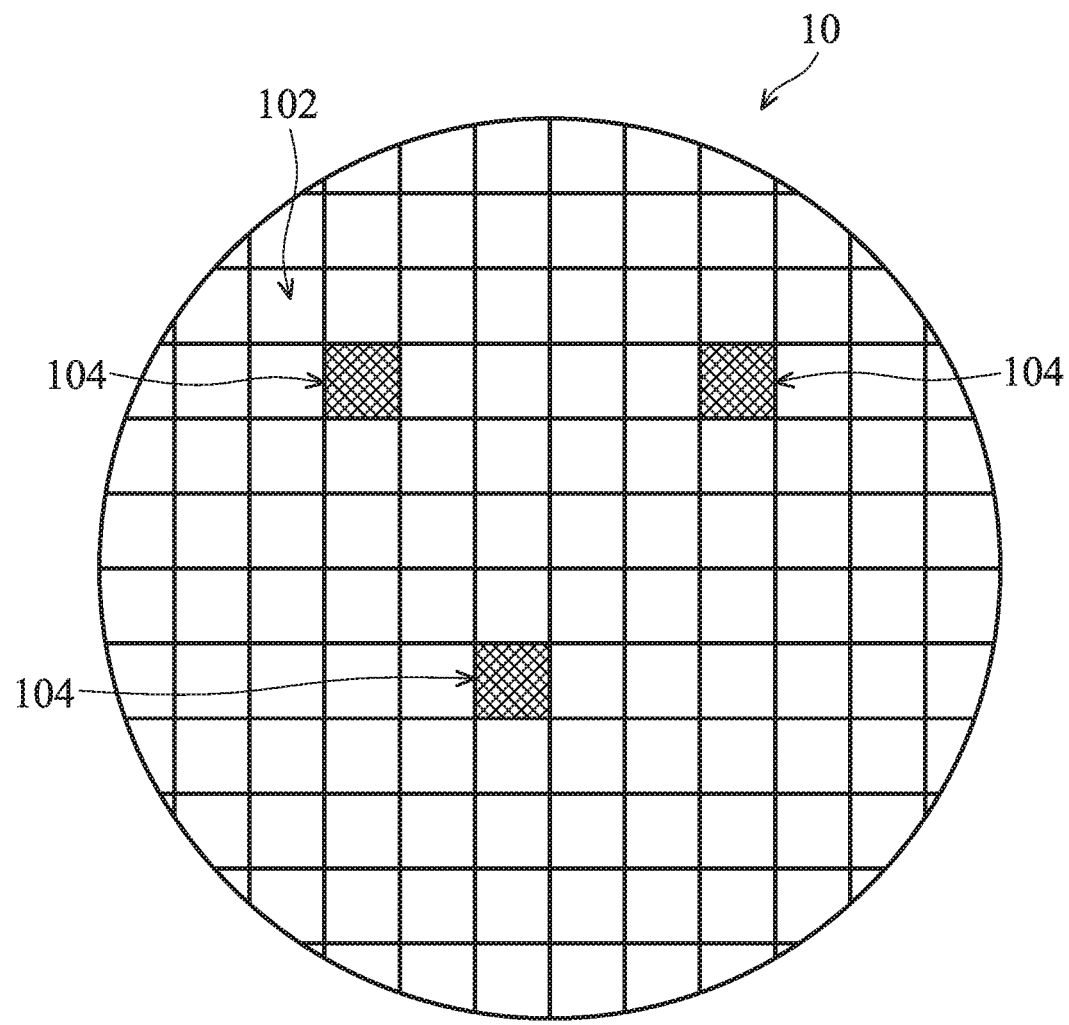
FIG. 9 is a top view of a semiconductor device structure, in accordance with some embodiments.

In some embodiments, each of the testing regions 104 occupies a smaller area than the area occupied by each of the device regions 102. However, embodiments of the disclosure are not limited thereto. Many variations and/or modifications can be made to embodiments of the disclosure. FIG. 9 is a top view of a semiconductor device structure, in accordance with some embodiments. In some embodiments, each of the testing regions 104 occupies an area that is substantially the same as the area occupied by each of the device regions 102.

Figure 10:
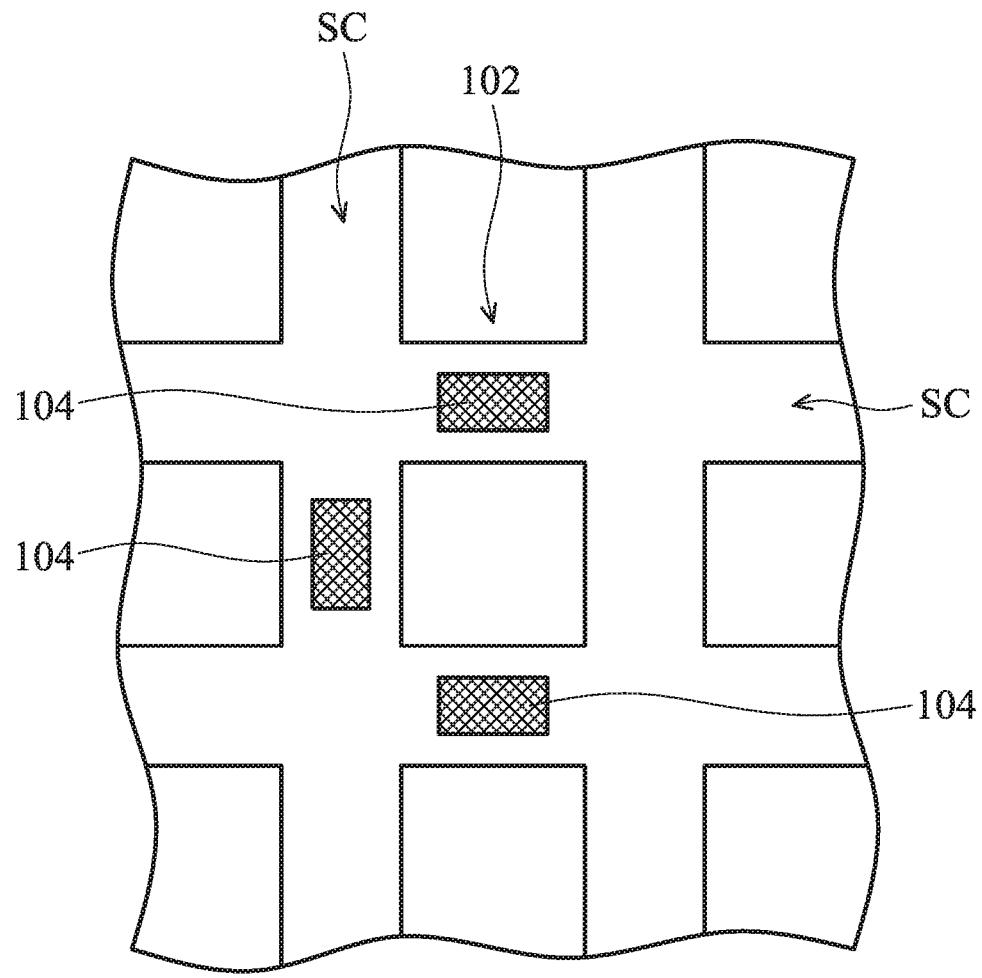
FIG. 10 is a top view of a semiconductor device structure, in accordance with some embodiments.

Many variations and/or modifications can be made to embodiments of the disclosure. FIG. 10 is a top view of a semiconductor device structure, in accordance with some embodiments. In some embodiments, the testing regions 104 are formed in the scribe lines SC between the device regions 102.

Figure 2:
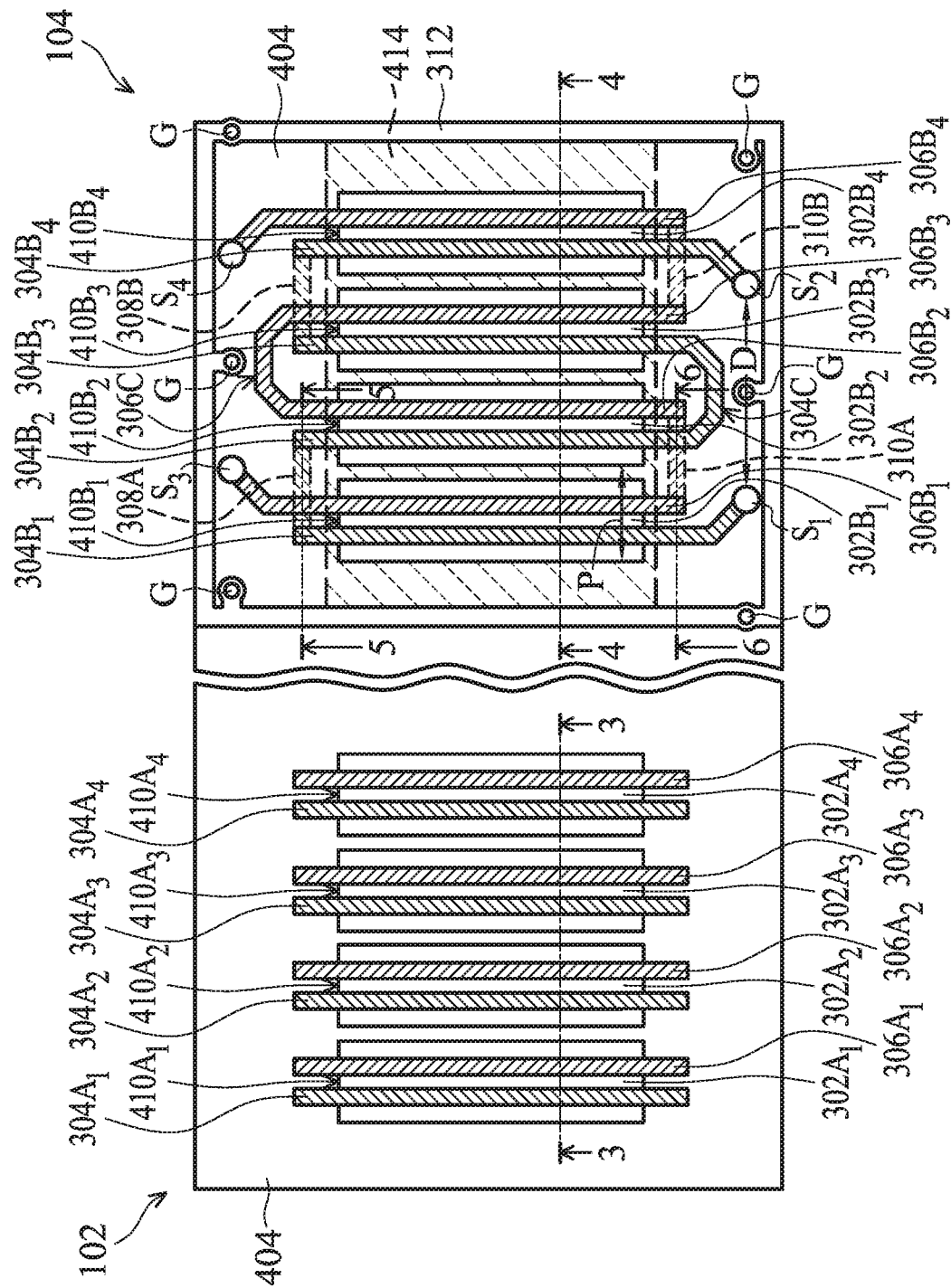
FIG. 2 is a top layout view of a semiconductor device structure, in accordance with some embodiments.

FIG. 2 is a top layout view of a semiconductor device structure, in accordance with some embodiments. In FIG. 2, one of the device regions 102 and one of the testing regions 104 are shown. In some embodiments, the device regions 102 include multiple inductors that are arranged in a column. In some embodiments, the inductors are mutual inductors.

However, many variations and/or modifications can be made to embodiments of the disclosure. In some other embodiments, some or all of the inductors formed in the device regions 102 are self-inductors.

Figure 3:
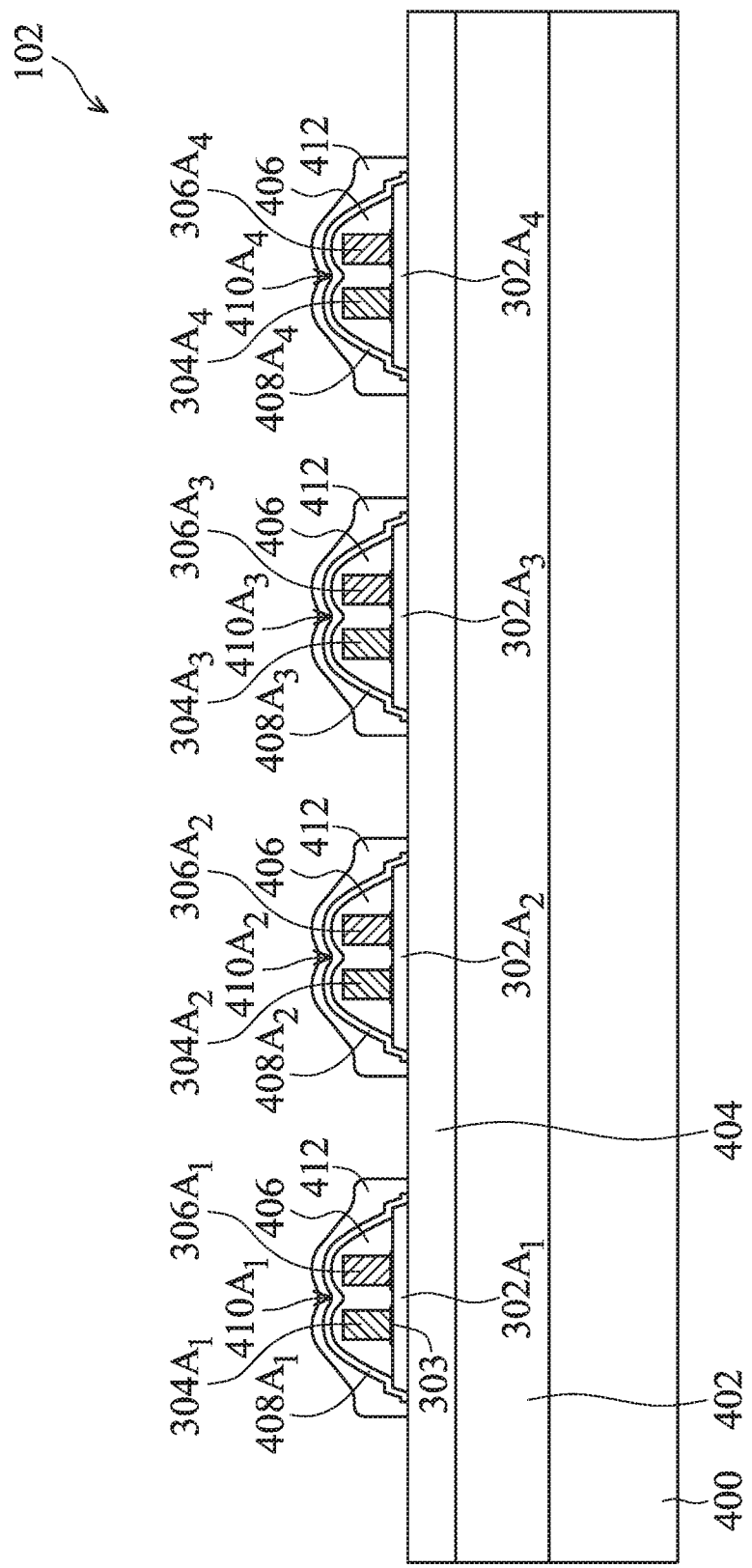
FIG. 3 is a cross-sectional view of a semiconductor device structure, in accordance with some embodiments.

FIG. 3 is a cross-sectional view of a semiconductor device structure, in accordance with some embodiments. In some embodiments, FIG. 3 shows the cross-sectional view of the semiconductor device structure taken along the line 3-3 in FIG. 2.

As shown in FIG. 3, the semiconductor device structure includes a semiconductor substrate 400 and an interconnection structure 402 formed over the semiconductor substrate 400. The interconnection structure 402 may include multiple dielectric layers and multiple conductive features. The conductive features may include conductive lines, conductive contacts, and conductive vias. These conductive features form electrical connections between the device elements and other elements to be formed later. In some embodiments, an insulating layer 404 is formed over the interconnection structure 402. The insulating layer 404 may be made of or include a polymer material. For example, the polymer material includes polyimide or another suitable material.

As shown in FIGS. 2 and 3, multiple magnetic elements $302A_1$, $302A_2$, $302A_3$, and $302A_4$ are formed over the insulating layer 404, in accordance with some embodiments. In some embodiments, each of the magnetic elements $302A_1$, $302A_2$, $302A_3$, and $302A_4$ is a stack of multiple magnetic sub-layers. The magnetic sub-layers may be made of or include an alloy containing cobalt, zirconium, and tantalum (CZT), an alloy containing cobalt and zirconium, an alloy containing iron and nickel, one or more other suitable materials, or a combination thereof. Many variations and/or modifications can be made to embodiments of the disclosure. In some other embodiments, each of the magnetic elements $302A_1$, $302A_2$, $302A_3$, and $302A_4$ is a single-layer structure.

The formation of the magnetic elements $302A_1$, $302A_2$, $302A_3$, and $302A_4$ may involve one or more deposition processes and one or more patterning processes. The deposition processes may include a physical vapor deposition (PVD) process, a chemical vapor deposition (CVD) process, an atomic layer deposition (ALD) process, one or more other applicable processes, or a combination thereof. The patterning processes may include the formation of patterned hard masks and one or more etching processes. In some embodiments, a stack of multiple magnetic material layers are deposited. Afterwards, one or more photolithography processes and one or more etching processes are used to partially remove the magnetic material layers. As a result, the remaining portions of the magnetic material layers form multiple magnetic elements including the magnetic elements $302A_1$, $302A_2$, $302A_3$, and $302A_4$.

As shown in FIG. 3, isolation elements 303 are formed over the magnetic elements $302A_1$, $302A_2$, $302A_3$, and $302A_4$, in accordance with some embodiments. The isolation elements 303 may be used to electrically isolate the magnetic elements $302A_1$, $302A_2$, $302A_3$, and $302A_4$ from conductive lines that will be formed over the magnetic elements $302A_1$, $302A_2$, $302A_3$, and $302A_4$. The isolation elements 303 may be made of or include silicon nitride, silicon oxynitride, silicon oxide, one or more other suitable materials, or a combination thereof. The formation of the isolation elements 303 may involve a deposition process and a patterning process.

As shown in FIGS. 2 and 3, multiple conductive lines $304A_1$, $304A_2$, $304A_3$, and $304A_4$ are formed over the insulating layer 404 and the magnetic elements $302A_1$, $302A_2$, $302A_3$, and $302A_4$, in accordance with some embodiments. The isolation elements 303 separate the conductive lines $304A_1$, $304A_2$, $304A_3$, and $304A_4$ from the magnetic elements $302A_1$, $302A_2$, $302A_3$, and $302A_4$. As shown in FIG. 2, the conductive lines $304A_1$, $304A_2$, $304A_3$, and $304A_4$ extends across the magnetic elements $302A_1$, $302A_2$, $302A_3$, and $302A_4$, respectively. In some embodiments, the conductive lines $304A_1$, $304A_2$, $304A_3$, and $304A_4$ are not electrically connected to each other. In some embodiments, the conductive lines $304A_1$, $304A_2$, $304A_3$, and $304A_4$ are physically separated from each other. Subsequently formed protective elements or isolation elements may be used to electrically isolate the conductive lines $304A_1$, $304A_2$, $304A_3$, and $304A_4$ from each other.

As shown in FIGS. 2 and 3, multiple conductive lines $306A_1$, $306A_2$, $306A_3$, and $306A_4$ are formed over the insulating layer 404 and the magnetic elements $302A_1$, $302A_2$, $302A_3$, and $302A_4$, in accordance with some embodiments. The isolation elements 303 separate the conductive lines $306A_1$, $306A_2$, $306A_3$, and $306A_4$ from the magnetic elements $302A_1$, $302A_2$, $302A_3$, and $302A_4$. As shown in FIG. 2, the conductive lines $306A_1$, $306A_2$, $306A_3$, and $306A_4$ extends across the magnetic elements $302A_1$, $302A_2$, $302A_3$, and $302A_4$, respectively. In some embodiments, the conductive lines $306A_1$, $306A_2$, $306A_3$, and $306A_4$ are not electrically connected to each other. In some embodiments, the conductive lines $306A_1$, $306A_2$, $306A_3$, and $306A_4$ are physically separated from each other. In some embodiments, each of the conductive lines $306A_1$, $306A_2$, $306A_3$, and $306A_4$ is not electrically connected to the conductive lines $304A_1$, $304A_2$, $304A_3$, and $304A_4$. Subsequently formed protective elements or isolation elements may be used to electrically isolate the conductive lines $304A_1$, $304A_2$, $304A_3$, $304A_4$, $306A_1$, $306A_2$, $306A_3$, and $306A_4$ from each other.

The conductive lines $304A_1$, $304A_2$, $304A_3$, $304A_4$, $306A_1$, $306A_2$, $306A_3$, and $306A_4$ may be made of or include copper, cobalt, aluminum, titanium, gold, one or more other suitable materials, or a combination thereof. The conductive lines $304A_1$, $304A_2$, $304A_3$, $304A_4$, $306A_1$, $306A_2$, $306A_3$, and $306A_4$ may be formed using an electroplating process, an electroless plating process, a PVD process, a CVD process, one or more other applicable processes, or a combination thereof. In some embodiments, the conductive lines $304A_1$, $304A_2$, $304A_3$, $304A_4$, $306A_1$, $306A_2$, $306A_3$, and $306A_4$ are simultaneously formed.

As shown in FIG. 3, protective elements 406 are formed to cover and protect the conductive lines $304A_1$, $304A_2$, $304A_3$, $304A_4$, $306A_1$, $306A_2$, $306A_3$, and $306A_4$, in accordance with some embodiments. The protective elements 406 may also be used to electrically isolate the conductive lines $304A_1$, $304A_2$, $304A_3$, $304A_4$, $306A_1$, $306A_2$, $306A_3$, and $306A_4$ from each other. The protective elements 406 may be made of or include a polymer material. The polymer material may include polyimide, epoxy-based resin, one or more other suitable materials, or a combination thereof. The formation of the protective elements 406 may involve a coating process and a photolithography process.

Afterwards, magnetic materials $408A_1$, $408A_2$, $408A_3$, and $408A_4$ are formed over the protective elements 406 to cover the conductive lines $304A_1$, $304A_2$, $304A_3$, $304A_4$, $306A_1$, $306A_2$, $306A_3$, and $306A_4$, as shown in FIG. 3 in accordance with some embodiments. Each of the magnetic materials $408A_1$, $408A_2$, $408A_3$, and $408A_4$ partially covers the conductive lines thereunder, as shown in FIGS. 2 and 3 in accordance with some embodiments. The material and formation method of the magnetic materials $408A_1$, $408A_2$, $408A_3$, and $408A_4$ may be the same as or similar to those of the magnetic elements $302A_1$, $302A_2$, $302A_3$, and $302A_4$.

Afterwards, protective elements 412 are formed to cover and protect the magnetic materials $408A_1$, $408A_2$, $408A_3$, and $408A_4$, as shown in FIG. 3 in accordance with some embodiments. The material and formation method of the protective elements 412 may be the same as or similar to those of the protective elements 406.

The magnetic materials and the magnetic elements together form multiple magnetic structures that wrap around portions of the conductive lines correspondingly. As shown in FIGS. 2 and 3, multiple magnetic structures $410A_1$, $410A_2$, $410A_3$, and $410A_4$ are formed. In FIG. 2, some elements shown in FIG. 3 are not shown in FIG. 2 for clarity. For example, the protective elements 406 and the magnetic materials $408A_1$, $408A_2$, $408A_3$, and $408A_4$ are not shown in FIG. 2. Therefore, the relationship between the conductive lines and the magnetic elements may be shown more clearly.

As shown in FIGS. 2 and 3, the magnetic structure $410A_1$ constructed by the magnetic element $302A_1$ and the magnetic material $408A_1$ wraps around a portion of the conductive line $304A_1$ and a portion of the conductive line $306A_1$, in accordance with some embodiments. Similarly, the magnetic structures $410A_2$, $410A_3$, and $410A_4$ wraps around portions of the conductive lines $304A_2$, $304A_3$, and $304A_4$, respectively. In some embodiments, the magnetic structures $410A_2$, $410A_3$, and $410A_4$ also wraps around portions of the conductive lines $306A_2$, $306A_3$, and $306A_4$, respectively.

In some embodiments, the magnetic structure $410A_1$ and the portion of the conductive line $304A_1$ surrounded by the magnetic structure $410A_1$ together forms a first inductor. The magnetic structure $410A_1$ and the portion of the conductive line $306A_1$ surrounded by the magnetic structure $410A_1$ together forms a second inductor. The first inductor and the second inductor may together form a mutual inductor. As shown in FIGS. 2 and 3, four mutual inductors each including the magnetic structures $410A_1$, $410A_2$, $410A_3$, and $410A_4$ are formed.

As shown in FIG. 2, similar to the device region 102, the testing region 104 also includes multiple inductors. In some embodiments, the inductors in the testing region 104 are arranged in a column. The inductors formed in the testing region 104 are substantially the same as those formed in the device region 102. The inductors in the testing region 104 and the device region 102 are formed using substantially the same process at the same time. Therefore, by detecting the quality and/or electrical properties of the inductors formed in the testing region 104, the corresponding quality and/or electrical properties of the inductors formed in the device region 102 are also obtained. By studying the inductors in the testing region 104, it is possible to timely monitor, improve, and refine a manufacturing process for forming the inductors in the device region 102.

Figure 4:
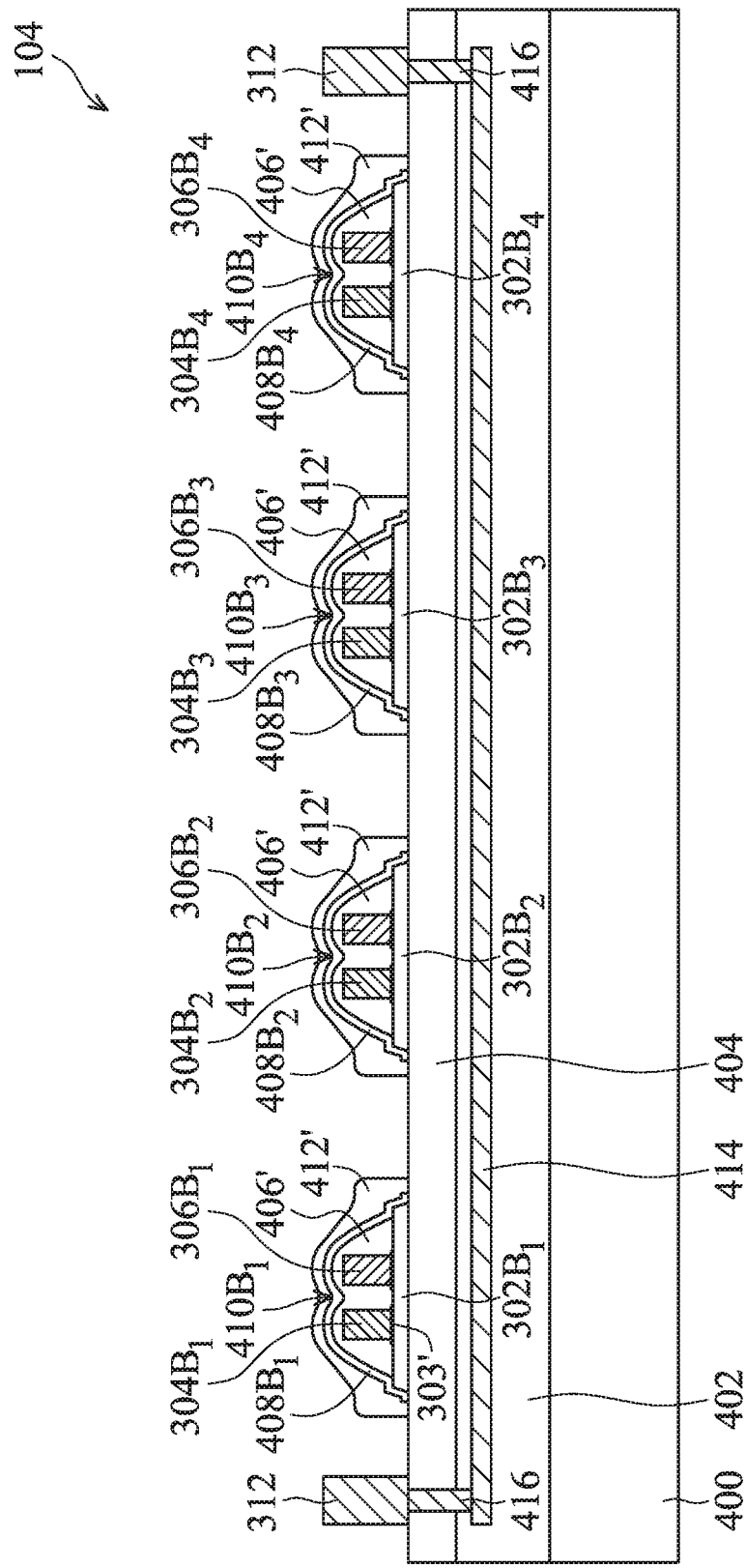
FIG. 4 is a cross-sectional view of a semiconductor device structure, in accordance with some embodiments.

FIG. 4 is a cross-sectional view of a semiconductor device structure, in accordance with some embodiments. In some embodiments, FIG. 4 shows the cross-sectional view of the semiconductor device structure taken along the line 4-4 in FIG. 2.

As shown in FIGS. 2 and 4, similar to the device region 102, multiple magnetic elements $302B_1$, $302B_2$, $302B_3$, and $302B_4$ are formed in the testing region 104, in accordance with some embodiments. The material and formation method of the magnetic elements $302B_1$, $302B_2$, $302B_3$, and $302B_4$ are the same as those of the magnetic elements $302A_1$, $302A_2$, $302A_3$, and $302A_4$ in the device region 102. The magnetic elements $302B_1$, $302B_2$, $302B_3$, and $302B_4$ and the magnetic elements $302A_1$, $302A_2$, $302A_3$, and $302A_4$ are simultaneously formed using the same processes.

As shown in FIG. 4, isolation elements 303' are formed over the magnetic elements $302B_1$, $302B_2$, $302B_3$, and $302B_4$, in accordance with some embodiments. The isolation elements 303' may be used to electrically isolate the magnetic elements $302B_1$, $302B_2$, $302B_3$, and $302B_4$ from conductive lines that will be formed over the magnetic elements $302B_1$, $302B_2$, $302B_3$, and $302B_4$. The material and formation method of the isolation elements 303' may be the same as those of the isolation elements 303 in the device region 102. The isolation elements 303 and 303' are simultaneously formed using the same processes.

As shown in FIGS. 2 and 4, similar to the device region 102, multiple conductive lines $304B_1$, $304B_2$, $304B_3$, and $304B_4$ are formed over the insulating layer 404 and the magnetic elements $302B_1$, $302B_2$, $302B_3$, and $302B_4$, in accordance with some embodiments. As shown in FIG. 2, the conductive lines $304B_1$, $304B_2$, $304B_3$, and $304B_4$ extends across the magnetic elements $302B_1$, $302B_2$, $302B_3$, and $302B_4$, respectively. In some embodiments, different from the conductive lines $304A_1$, $304A_2$, $304A_3$, and $304A_4$ that are electrically isolated from each other, the conductive lines $304B_1$, $304B_2$, $304B_3$, and $304B_4$ are electrically connected to each other.

As shown in FIG. 2, the conductive lines $304B_1$, $304B_2$, $304B_3$, and $304B_4$ are electrically connected in series, in accordance with some embodiments. In some embodiments, the conductive lines $304B_2$ and $304B_3$ are electrically connected in series through a connection portion 304C, as shown in FIG. 2. In some embodiments, the conductive lines $304B_1$ and $304B_2$ are electrically connected in series through a conductive feature 308A that is formed between the insulating layer 404 and the semiconductor substrate 400. In some embodiments, the conductive feature 308A is formed in the interconnection structure 402. In FIG. 2, the conductive feature 308A that is below the insulating layer 404 is illustrated in dotted lines. In some embodiments, the conductive lines $304B_3$ and $304B_4$ are electrically connected in series through a conductive feature 308B that is formed between the insulating layer 404 and the semiconductor substrate 400.

As shown in FIGS. 2 and 4, multiple conductive lines $306B_1$, $306B_2$, $306B_3$, and $306B_4$ are formed over the insulating layer 404 and the magnetic elements $302B_1$, $302B_2$, $302B_3$, and $302B_4$, in accordance with some embodiments. As shown in FIG. 2, the conductive lines $306B_1$, $306B_2$, $306B_3$, and $306B_4$ extends across the magnetic elements $302B_1$, $302B_2$, $302B_3$, and $302B_4$, respectively. In some embodiments, different from the conductive lines $306A_1$, $306A_2$, $306A_3$, and $306A_4$ that are electrically isolated from each other, the conductive lines $306B_1$, $306B_2$, $306B_3$, and $306B_4$ are electrically connected to each other. In some embodiments, each of the conductive lines $306B_1$, $306B_2$, $306B_3$, and $306B_4$ is not electrically connected to the conductive lines $304B_1$, $304B_2$, $304B_3$, and $304B_4$. Subsequently formed protective elements or isolation elements may be used to electrically isolate the conductive lines $304B_1$, $304B_2$, $304B_3$, and $304B_4$ from the conductive lines $306B_1$, $306B_2$, $306B_3$, and $306B_4$.

As shown in FIG. 2, the conductive lines $306B_1$, $306B_2$, $306B_3$, and $306B_4$ are electrically connected in series, in accordance with some embodiments. In some embodiments, the conductive lines $306B_2$ and $306B_3$ are electrically connected in series through a connection portion 306C, as shown in FIG. 2. In some embodiments, the conductive lines $306B_1$ and $306B_2$ are electrically connected in series through a conductive feature 310A that is formed between the insulating layer 404 and the semiconductor substrate 400. In some embodiments, the conductive feature 310A is formed in the interconnection structure 402. In FIG. 2, the conductive feature 310A that is below the insulating layer 404 is illustrated in dotted lines. In some embodiments, the conductive lines $306B_3$ and $306B_4$ are electrically connected in series through a conductive feature 310B that is formed between the insulating layer 404 and the semiconductor substrate 400.

In some embodiments, the conductive line $306B_1$ extends across the conductive feature 308A that links the conductive lines $304B_1$ and the $304B_2$, as shown in FIG. 2. The conductive line $306B_1$ is electrically isolated from the conductive feature 308A by the insulating layer 404. In some embodiments, the conductive line $306B_3$ extends across the conductive feature 308B that links the conductive lines $304B_3$ and the $304B_4$, as shown in FIG. 2. The conductive line $306B_3$ is electrically isolated from the conductive feature 308B by the insulating layer 404.

In some embodiments, the conductive line $304B_2$ extends across the conductive feature 310A that links the conductive lines $306B_1$ and the $306B_2$, as shown in FIG. 2. The conductive line $304B_2$ is electrically isolated from the conductive feature 310A by the insulating layer 404. In some embodiments, the conductive line $304B_4$ extends across the conductive feature 310B that links the conductive lines $306B_3$ and the $306B_4$, as shown in FIG. 2. The conductive line $304B_4$ is electrically isolated from the conductive feature 310B by the insulating layer 404.

The material and formation method of the conductive lines $304B_1$, $304B_2$, $304B_3$, $304B_4$, $306B_1$, $306B_2$, $306B_3$, and $306B_4$ are the same as those of the conductive lines $304A_1$, $304A_2$, $304A_3$, $304A_4$, $306A_1$, $306A_2$, $306A_3$, and $306A_4$. In some embodiments, these conductive lines are simultaneously formed using the same processes.

As shown in FIG. 4, protective elements 406' are formed to cover and protect the conductive lines $304B_1$, $304B_2$, $304B_3$, $304B_4$, $306B_1$, $306B_2$, $306B_3$, and $306B_4$, in accordance with some embodiments. The material and formation method of the protective elements 406' may be the same as those of the protective elements 406 in the device region 102. In some embodiments, the protective elements 406' and 406 are simultaneously formed using the same processes.

Afterwards, magnetic materials $408B_1$, $408B_2$, $408B_3$, and $408B_4$ are formed over the protective elements 406' to cover the conductive lines $304B_1$, $304B_2$, $304B_3$, $304B_4$, $306B_1$, $306B_2$, $306B_3$, and $306B_4$, as shown in FIG. 4 in accordance with some embodiments. The material and formation method of the magnetic materials $408B_1$, $408B_2$, $408B_3$, and $408B_4$ may be the same as or similar to those of the magnetic materials $408A_1$, $408A_2$, $408A_3$, and $408A_4$. In some embodiments, the magnetic materials $408B_1$, $408B_2$, $408B_3$, and $408B_4$ and the magnetic materials $408A_1$, $408A_2$, $408A_3$, and $408A_4$ are simultaneously formed using the same processes.

Afterwards, protective elements 412' are formed to cover and protect the magnetic materials $408B_1$, $408B_2$, $408B_3$, and $408B_4$, as shown in FIG. 4 in accordance with some embodiments. The material and formation method of the protective elements 412' may be the same as or similar to those of the protective elements 412 in the device region 102. In some embodiments, the protective elements 412' and 412 are simultaneously formed using the same processes.

The magnetic materials and the magnetic elements together form multiple magnetic structures that wrap around portions of the conductive lines correspondingly. As shown in FIGS. 2 and 4, multiple magnetic structures $410B_1$, $410B_2$, $410B_3$, and $410B_4$ are formed. In some embodiments, each of the magnetic structures $410B_1$, $410B_2$, $410B_3$, and $410B_4$ has a shape and a size that are substantially the same as those of each of the magnetic structures $410A_1$, $410A_2$, $410A_3$, and $410A_4$ in the device region 102.

In FIG. 2, some elements shown in FIG. 4 are not shown in FIG. 2 for clarity. For example, the protective elements 406' and the magnetic materials $408B_1$, $408B_2$, $408B_3$, and $408B_4$ are not shown in FIG. 2. Therefore, the relationship between the conductive lines and the magnetic elements may be shown more clearly.

As shown in FIGS. 2 and 4, the magnetic structure $410B_1$ constructed by the magnetic element $302B_1$ and the magnetic material $408B_1$ wraps around a portion of the conductive line $304B_1$ and a portion of the conductive line $306B_1$, in accordance with some embodiments. Similarly, the magnetic structures $410B_2$, $410B_3$, and $410B_4$ wraps around portions of the conductive lines $304B_2$, $304B_3$, and $304B_4$, respectively. In some embodiments, the magnetic structures $410B_2$, $410B_3$, and $410B_4$ also wraps around portions of the conductive lines $306B_2$, $306B_3$, and $306B_4$, respectively.

In some embodiments, the magnetic structure $410B_1$ and the portion of the conductive line $304B_1$ surrounded by the magnetic structure $410B_1$ together forms a first inductor. The magnetic structure $410B_1$ and the portion of the conductive line $306B_1$ surrounded by the magnetic structure $410B_1$ together forms a second inductor. The first inductor and the second inductor may together form a mutual inductor. As shown in FIGS. 2 and 4, four mutual inductors each including the magnetic structures $410B_1$, $410B_2$, $410B_3$, and $410B_4$ are formed.

The inductors formed in the device regions 102 and the nearby testing regions 104 are formed simultaneously using the same processes. Therefore, by detecting the quality and/or electrical properties of the inductors formed in the testing regions 104, the corresponding quality and/or electrical properties of the inductors formed in the device regions 102 may also be obtained. By studying the inductors in the testing regions 104, it is possible to monitor, improve, and refine a manufacturing process for forming the inductors in the device regions 102.

However, as the continuing evolution toward smaller device size and higher density, the inductance (such as the mutual inductance) that is generated by the inductor becomes smaller and smaller. As a result, it becomes difficult to measure the inductance of the individual inductor. The measurement error might be large since the measured signals become small due to the small device size. As the device size continues to shrink, the pitch between the conductive lines becomes very short. As a result, performing a WAT using automatic equipment becomes difficult since the probe size and/or probe pitch may need to be further shrunk to fit the smaller pitch between the conductive lines. The testing cost and testing time may be greatly increased. It would be very expensive if the automatic equipment for WAT needs to be updated frequently since the device size continues to shrink.

In accordance with some embodiments of the disclosure, by designing the conductive features 308A and 308B and the connection portion 304C, the conductive lines $304B_1$, $304B_2$, $304B_3$, and $304B_4$ are linked together to be electrically connected in series. The inductors constructed by the magnetic structures $410B_1$, $410B_2$, $410B_3$, and $410B_4$ and the conductive lines $304B_1$, $304B_2$, $304B_3$, and $304B_4$ are thus electrically connected in series.

Similarly, by designing the conductive features 310A and 310B and the connection portion 306C, the conductive lines $306B_1$, $306B_2$, $306B_3$, and $306B_4$ are linked together to be electrically connected in series. The inductors constructed by the magnetic structures $410B_1$, $410B_2$, $410B_3$, and $410B_4$ and the conductive lines $306B_1$, $306B_2$, $306B_3$ and $306B_4$ are thus electrically connected in series.

Because the inductors are electrically connected in series, the total inductance (such as the mutual inductance) is significantly increased. The measured signal is thus greatly increased. The detecting of the signal becomes easier, and the measurement error is reduced accordingly.

As shown in FIG. 2, the conductive line $304B_1$ is connected to a testing bump $S_1$, and the conductive line $304B_4$ is connected to a testing bump $S_2$, in accordance with some embodiments. In some embodiments, the conductive line $306B_1$ is connected to a testing bump $S_3$, and the conductive line $306B_4$ is connected to a testing bump $S_4$.

In some embodiments, a shortest distance D between the testing bumps $S_1$ and $S_2$ is greater than two times a pitch P between the magnetic elements $302B_1$ and $302B_2$. In some embodiments, a pitch between the testing bumps $S_1$ and $S_2$ is in a range from about 120 µm to about 400 µm. In some embodiments, the pitch between the testing bumps $S_1$ and $S_2$ is greater than about 300 µm for high-current testing. Because the distance between the testing bumps used for detecting the electrical signal is increased, performing a WAT using automatic equipment becomes easier since the probe size and/or probe pitch may not need to be further shrunk. The testing cost and testing time may be greatly reduced.

Figure 8:
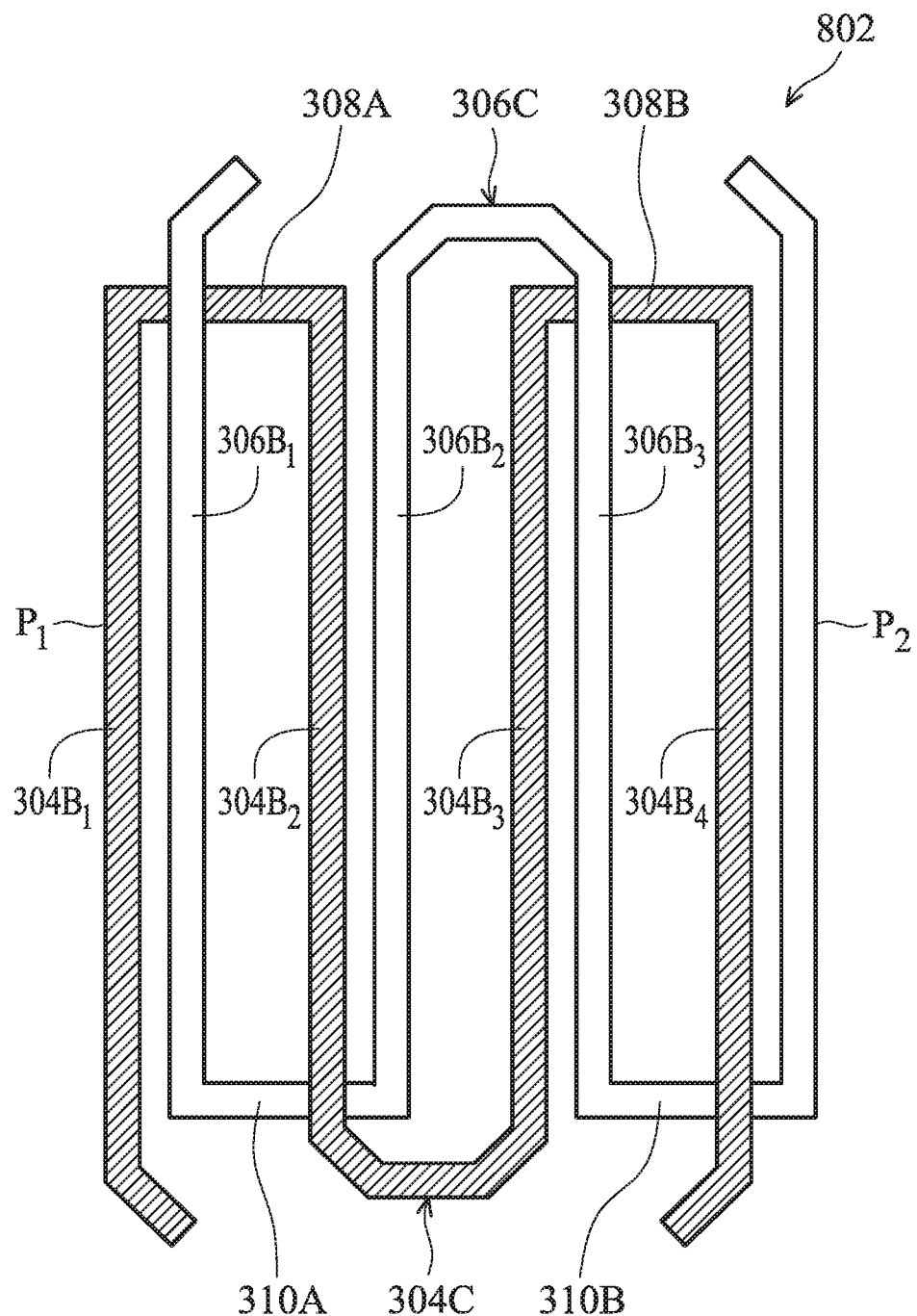
FIG. 8 is a top layout view of conductive lines of a semiconductor device structure, in accordance with some embodiments.

As shown in FIG. 2, the conductive lines $304B_1$, $304B_2$, $304B_3$, $304B_4$, $306B_1$, $306B_2$, $306B_3$, and $306B_4$ and the conductive features 308A, 308B, 310A, and 310B together form a double helix structure. FIG. 8 is a top layout view of conductive lines of a semiconductor device structure, in accordance with some embodiments. As shown in FIG. 8, the conductive lines $304B_1$, $304B_2$, $304B_3$, and $304B_4$ and the conductive features 308A and 308B together form a first conductive path $P_1$. The conductive lines $306B_1$, $306B_2$, $306B_3$, and $306B_4$ and the conductive features 310A and 310B together form a second conductive path $P_2$. In some embodiments, the conductive paths $P_1$ and $P_2$ are physically separated from each other. In some embodiments, the conductive paths $P_1$ and $P_2$ are electrically isolated from each other and magnetically coupled with each other. In some embodiments, the conductive paths $P_1$ and $P_2$ together form a double helix structure 802, as shown in FIG. 8.

In some embodiments, the distribution of the conductive path $P_1$ is symmetric with the distribution of the conductive path $P_2$. For example, if the conductive path $P_2$ is turned upside down and moved leftward, the conductive path $P_2$ would overlap the conductive path $P_1$. By designing the conductive paths $P_1$ and $P_2$ with the double helix structure 802, the precision and accuracy of the measurement of the inductance is greatly improved.

Many variations and/or modifications can be made to embodiments of the disclosure. In some embodiments, a shielding ring 312 is formed to surround the inductors formed in the testing region 104, as shown in FIG. 2. In some embodiments, radio-frequency (RF) signals are used to detect the inductance of the inductors formed in the testing region 104. The shielding ring 312 may be used to collect the fringing field from the inductors near the edges. The precision and accuracy of the measurement may be improved.

As shown in FIG. 2, the shielding ring 312 is electrically connected to ground bumps G, in accordance with some embodiments. In some embodiments, the testing bump $S_1$, one of the ground bumps G, and the testing bump $S_2$ are sequentially arranged in a column, as shown in FIG. 2. In some embodiments, the testing bump $S_3$, one of the ground bumps G, and the testing bump $S_4$ are sequentially arranged in a column, as shown in FIG. 2.

In some embodiments, the shielding ring 312 and the conductive lines wrapped by the magnetic structures $410B_1$, $410B_2$, $410B_3$, and $410B_4$ are made of the same material. In some embodiments, the shielding ring 312 and the conductive lines wrapped by the magnetic structures are simultaneously formed using the same processes.

Many variations and/or modifications can be made to embodiments of the disclosure. In some embodiments, a shielding element 414 is formed between the semiconductor substrate 400 and the insulating layer 404, as shown in FIGS. 2 and 4. In some embodiments, the shielding element 414 is formed in the interconnection structure 402, as shown in FIG. 4. The shielding element 414 may be used to collect the fringing field between the nearby inductors. The precision and accuracy of the measurement may thus be improved.

In some embodiments, the shielding element 414 extends beyond edges of the magnetic elements $302B_1$, $302B_2$, $302B_3$, and $302B_4$, as shown in FIGS. 2 and 4. In some embodiments, the shielding element 414 is electrically connected to the shielding ring 312 through conductive vias 416, as shown in FIG. 4.

Figure 7:
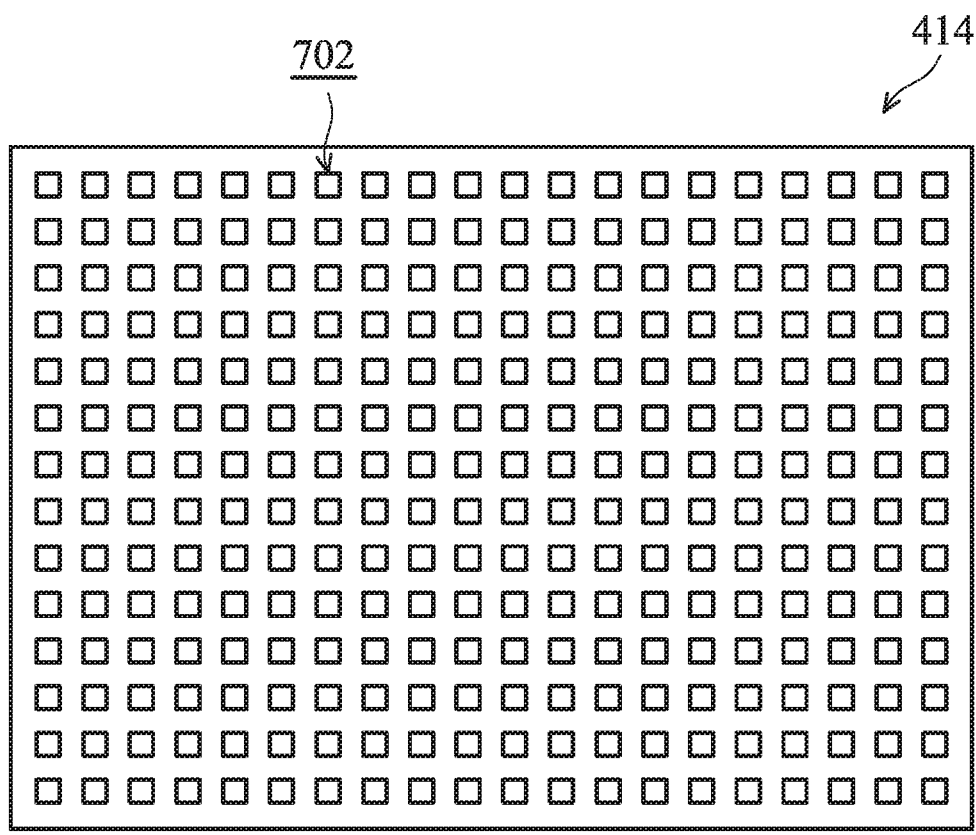
FIG. 7 is a top layout view of a shielding element of a semiconductor device structure, in accordance with some embodiments.

FIG. 7 is a top layout view of a shielding element of a semiconductor device structure, in accordance with some embodiments. In some embodiments, FIG. 7 shows the top layout view of the shielding element 414 shown in FIGS. 2 and 4. In some embodiments, the shielding element 414 is a conductive mesh that includes multiple openings 702. The openings 702 may help to reduce parasitic capacitance between the shielding element 414 and the inductors, so as to improve the testing precision and accuracy.

Figure 5:
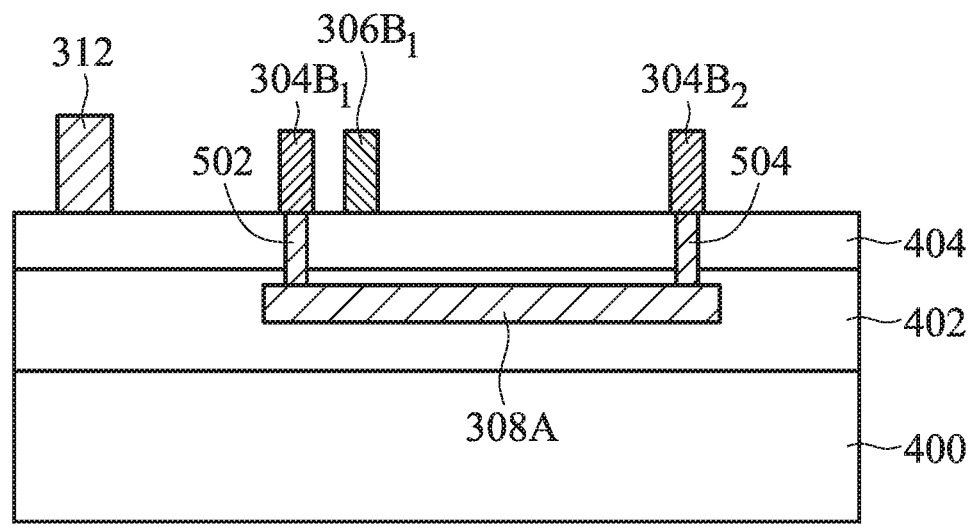
FIG. 5 is a cross-sectional view of a semiconductor device structure, in accordance with some embodiments.

FIG. 5 is a cross-sectional view of a semiconductor device structure, in accordance with some embodiments. In some embodiments, FIG. 5 shows the cross-sectional view of the semiconductor device structure taken along the line 5-5 in FIG. 2. In some embodiments, the conductive line $304B_1$ is electrically connected to the conductive feature 308A through a conductive via 502. The conductive feature 308A is electrically connected to the conductive line $304B_2$ through a conductive via 504. As a result, the conductive lines $304B_1$ and $304B_2$ are electrically connected in series through the conductive feature 308A formed in the interconnection structure 402. In some embodiments, the conductive line $306B_1$ extends across the conductive feature 308A, as shown in FIGS. 2 and 5. The conductive line $306B_1$ is electrically isolated from the conductive feature 308A by the insulating layer 404 and one or more dielectric layers in the interconnection structure 402.

Figure 6:
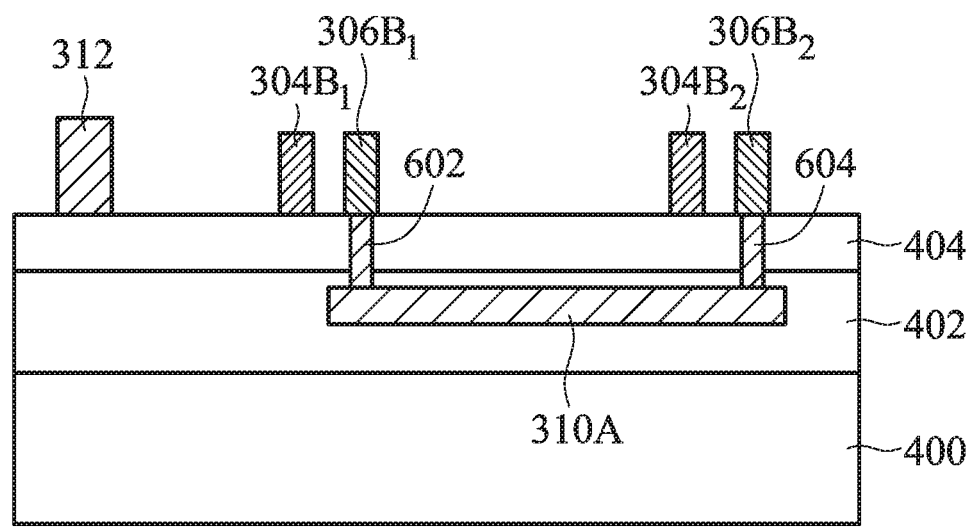
FIG. 6 is a cross-sectional view of a semiconductor device structure, in accordance with some embodiments.

FIG. 6 is a cross-sectional view of a semiconductor device structure, in accordance with some embodiments. In some embodiments, FIG. 6 shows the cross-sectional view of the semiconductor device structure taken along the line 6-6 in FIG. 2. In some embodiments, the conductive line $306B_1$ is electrically connected to the conductive feature 310A through a conductive via 602. The conductive feature 310A is electrically connected to the conductive line $306B_2$ through a conductive via 604. As a result, the conductive lines $306B_1$ and $306B_2$ are electrically connected in series through the conductive feature 310A formed in the interconnection structure 402. In some embodiments, the conductive line $304B_2$ extends across the conductive feature 310A, as shown in FIGS. 2 and 6. The conductive line $304B_2$ is electrically isolated from the conductive feature 308A by the insulating layer 404 and one or more dielectric layers in the interconnection structure 402.

Many variations and/or modifications can be made to embodiments of the disclosure. In some other embodiments, the shielding ring 312 surrounds more than four inductors. In some other embodiments, more than four inductors are electrically connected in series to enhance to electrical signals to be measured. As a result, the testing precision and accuracy is improved. The fabrication processes may therefore be monitored, improved, and refined more timely and more appropriately.

Embodiments of the disclosure simultaneously form inductors in a device region and a testing region using the same processes. Through the design of conductive paths in the testing region, the inductors in the testing region are electrically connected in series. As a result, the measured inductance in the testing region is enlarged. The testing precision and accuracy is therefore improved. In addition, due to the design of conductive paths, the pitch between the testing bumps is significantly enlarged, which allows the WAT process to be performed using automatic equipment. The testing cost and efficiencies are greatly improved.

In accordance with some embodiments, a semiconductor device structure is provided. The semiconductor device structure includes a semiconductor substrate and a first magnetic element and a second magnetic element over the semiconductor substrate. The semiconductor device structure also includes a first conductive line extending across the first magnetic element and a second conductive line extending across the second magnetic element. The second conductive line is electrically connected to the first conductive line. The semiconductor device structure further includes a first magnetic material partially covering the first conductive line and a second magnetic material partially covering the second conductive line.

In accordance with some embodiments, a semiconductor device structure is provided. The semiconductor device structure includes a semiconductor substrate having a device region and a testing region. The semiconductor device structure also includes multiple first conductive lines over the device region, and the first conductive lines are not electrically connected to each other. The semiconductor device structure further includes multiple first magnetic structures wrapping around portions of the first conductive lines. In addition, the semiconductor device structure includes multiple second conductive lines over the testing region, and the second conductive lines are electrically connected in series. The semiconductor device structure also includes second magnetic structures wrapping around portions of the second conductive lines. Each of the second magnetic structures has a shape and a size that are substantially the same as those of each of the first magnetic structures.

In accordance with some embodiments, a semiconductor device structure is provided. The semiconductor device structure includes a semiconductor substrate having a testing region and multiple first conductive lines over the testing region. The first conductive lines are electrically connected in series. The semiconductor device structure also includes multiple second conductive lines over the testing region. The second conductive lines are electrically connected in series, and the second conductive lines are physically separated from the first conductive lines. The semiconductor device structure further includes multiple magnetic structures wrapping around portions of the first conductive lines and wrapping around portions of the second conductive lines. The magnetic structures are arranged in a column.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a first magnetic element and a second magnetic element over the semiconductor substrate;
   a first conductive line extending across the first magnetic element and exceeding edges of the first magnetic element;
   a second conductive line extending across the second magnetic element, wherein the second conductive line is electrically connected to the first conductive line;
   a first magnetic material partially covering the first conductive line; and
   a second magnetic material partially covering the second conductive line.

2. The semiconductor device structure as claimed in claim 1, further comprising:
   a third conductive line extending across the first magnetic element; and
   a fourth conductive line extending across the second magnetic element, wherein the fourth conductive line is electrically connected to the third conductive line, and the fourth conductive line is electrically isolated from the first conductive line.

3. The semiconductor device structure as claimed in claim 2, wherein the first magnetic material partially covers the third conductive line, and the second magnetic material partially covers the fourth conductive line.

4. The semiconductor device structure as claimed in claim 2, further comprising:
   an insulating layer between the semiconductor substrate and the first magnetic element;
   a first conductive feature between the insulating layer and the semiconductor substrate, wherein the first conductive line is electrically connected to the second conductive line through the first conductive feature; and
   a second conductive feature between the insulating layer and the semiconductor substrate, wherein the third conductive line is electrically connected to the fourth conductive line through the second conductive feature.

5. The semiconductor device structure as claimed in claim 4, wherein the third conductive line extends across the first conductive feature, and the second conductive line extends across the second conductive feature.

6. The semiconductor device structure as claimed in claim 4, wherein the first conductive line, the first conductive feature, the second conductive line, the third conductive line, the second conductive feature, and the fourth conductive line together form a double helix structure.

7. The semiconductor device structure as claimed in claim 1, further comprising a shielding ring over the semiconductor substrate, wherein the shielding ring surrounds the first magnetic element, the second magnetic element, the first conductive line, and the second conductive line.

8. The semiconductor device structure as claimed in claim 7, further comprising a shielding element, wherein the shielding element is above the semiconductor substrate, and the shielding element is below the first magnetic element and the second magnetic element.

9. The semiconductor device structure as claimed in claim 8, wherein the shielding element is a conductive mesh extending beyond edges of the first magnetic element and the second magnetic element.

10. The semiconductor device structure as claimed in claim 9, wherein the shielding element is electrically connected to the shielding ring.

11. A semiconductor device structure, comprising:
    a semiconductor substrate having a device region and a testing region;
    a plurality of first conductive lines over the device region, wherein the first conductive lines are not electrically connected to each other;
    a plurality of first magnetic structures wrapping around portions of the first conductive lines;
    a plurality of second conductive lines over the testing region, wherein the second conductive lines are electrically connected in series; and
    a plurality of second magnetic structures wrapping around portions of the second conductive lines, wherein each of the second magnetic structures has a shape and a size that are substantially the same as those of each of the first magnetic structures.

12. The semiconductor device structure as claimed in claim 11, further comprising:
    a plurality of third conductive lines over the device region, wherein the third conductive lines are not electrically connected to each other, each of the third conductive lines is not electrically connected to the first conductive lines, and the first magnetic structures wrap around portions of the third conductive lines; and
    a plurality of fourth conductive lines over the testing region, wherein the fourth conductive lines are electrically connected in series, each of the fourth conductive lines is not electrically connected to the second conductive lines, and the second magnetic structures wrap around portions of the fourth conductive lines.

13. The semiconductor device structure as claimed in claim 12, further comprising:
    an insulating layer separating the semiconductor substrate from the second conductive lines and the fourth conductive lines;
    a plurality of first conductive features between the semiconductor substrate and the insulating layer, wherein the second conductive lines are electrically connected in series through the first conductive features; and
    a plurality of second conductive features between the semiconductor substrate and the insulating layer, wherein the fourth conductive lines are electrically connected in series through the second conductive features.

14. The semiconductor device structure as claimed in claim 13, wherein one of the fourth conductive lines over the testing region extends across one of the first conductive features, and one of the second conductive lines extends across one of the second conductive features.

15. The semiconductor device structure as claimed in claim 14, wherein the second conductive lines and the first conductive features together form a first conductive path, the fourth conductive lines and the second conductive features together form a second conductive path, the first conductive path and the second conductive path are physically separated from each other, and the first conductive path and the second conductive path together form a double helix structure.

16. The semiconductor device structure as claimed in claim 13, further comprising:
    a shielding ring over the testing region of the semiconductor substrate, wherein the shielding ring surrounds the second conductive lines and the second magnetic structures; and
    a shielding element between the insulating layer and the semiconductor substrate, wherein the shielding element extends beyond edges of the second magnetic structures.

17. The semiconductor device structure as claimed in claim 16, wherein the second conductive lines are electrically connected to a first testing bump and a second testing bump, the shielding ring is electrically connected to a ground bump, the first testing bump, the ground bump, and the second testing bump are sequentially arranged in a column, and a shortest distance between the first testing bump and the second testing bump is greater than two times a pitch between two of the second magnetic structures that are next to each other.

18. A semiconductor device structure, comprising:
a semiconductor substrate having a testing region;
a plurality of first conductive lines over the testing region, wherein the first conductive lines are electrically connected in series;
a plurality of second conductive lines over the testing region, wherein the second conductive lines are electrically connected in series, and the second conductive lines are physically separated from the first conductive lines; and
a plurality of magnetic structures wrapping around portions of the first conductive lines and wrapping around portions of the second conductive lines, wherein the magnetic structures are arranged in a column.

19. The semiconductor device structure as claimed in claim 18, wherein the first conductive lines are electrically connected in series through a first conductive feature, the second conductive lines are electrically connected in series through a second conductive feature, one of the second conductive lines extends across the first conductive feature, the second conductive lines are separated from the first conductive feature, one of the first conductive lines extends across the second conductive feature, and the first conductive lines are separated from the second conductive feature.

20. The semiconductor device structure as claimed in claim 18, wherein the semiconductor substrate has a plurality of device regions surrounding the testing region, and the semiconductor device structure further comprises:
a plurality of second magnetic structures over the device regions, wherein a shape and a size of each of the second magnetic structures are substantially the same as a shape and a size of each of the magnetic structures, respectively.

* * * * *